United States Patent [19]
Garcia

[11] Patent Number: 5,949,259
[45] Date of Patent: Sep. 7, 1999

[54] ZERO-DELAY SLEW-RATE CONTROLLED OUTPUT BUFFER

[75] Inventor: Florent Garcia, Trets, France

[73] Assignee: Atmel Corporation, San Jose, Calif.

[21] Appl. No.: 08/974,579

[22] Filed: Nov. 19, 1997

[51] Int. Cl.[6] ................................................ H03B 1/00
[52] U.S. Cl. ........................ 327/111; 327/379; 327/112; 327/108; 326/87; 326/26
[58] Field of Search ................... 326/26, 27, 87, 326/88; 327/108, 109, 110, 111, 112, 379, 382, 389, 390

[56] References Cited

U.S. PATENT DOCUMENTS

| | | | |
|---|---|---|---|
| 3,631,267 | 12/1971 | Heimbigner | 326/88 |
| 4,129,794 | 12/1978 | Dickson et al. | 326/88 |
| 4,797,579 | 1/1989 | Lewis | 307/443 |
| 4,972,100 | 11/1990 | Lim et al. | 307/443 |
| 4,987,324 | 1/1991 | Wong et al. | 307/451 |
| 5,013,940 | 5/1991 | Ansel | 307/473 |
| 5,117,131 | 5/1992 | Ochi et al. | 307/448 |
| 5,216,293 | 6/1993 | Sei et al. | 307/443 |
| 5,218,239 | 6/1993 | Boomer | 326/27 |
| 5,420,525 | 5/1995 | Maloberti et al. | 326/27 |
| 5,469,096 | 11/1995 | Nessi et al. | 327/112 |
| 5,471,150 | 11/1995 | Jung et al. | 326/87 |
| 5,537,067 | 7/1996 | Carvajal et al. | 327/108 |
| 5,546,029 | 8/1996 | Koke | 327/108 |
| 5,568,081 | 10/1996 | Lui et al. | 327/380 |
| 5,587,678 | 12/1996 | Dijkmans | 327/108 |
| 5,828,262 | 10/1998 | Rees | 327/390 |

*Primary Examiner*—Timothy P. Callahan
*Assistant Examiner*—An T. Luu
*Attorney, Agent, or Firm*—Thomas Schneck

[57] ABSTRACT

An output buffer in accordance with the present invention exhibits a fixed output signal slew rate. The output signal behavior is independent of the capacitive load seen by the buffer. The circuit includes a capacitive feedback path from the output node to circuitry which drives the output transistors. In one embodiment, the feedback path comprises two capacitive elements, one which comes into play during a rising edge transition and the other which affects a falling edge transition. In a second embodiment, a single capacitive element is coupled to a switching circuit for use during either a falling transition or a rising transition. The second embodiment provides precharging of the output transistor gates, and so improves response time.

5 Claims, 5 Drawing Sheets

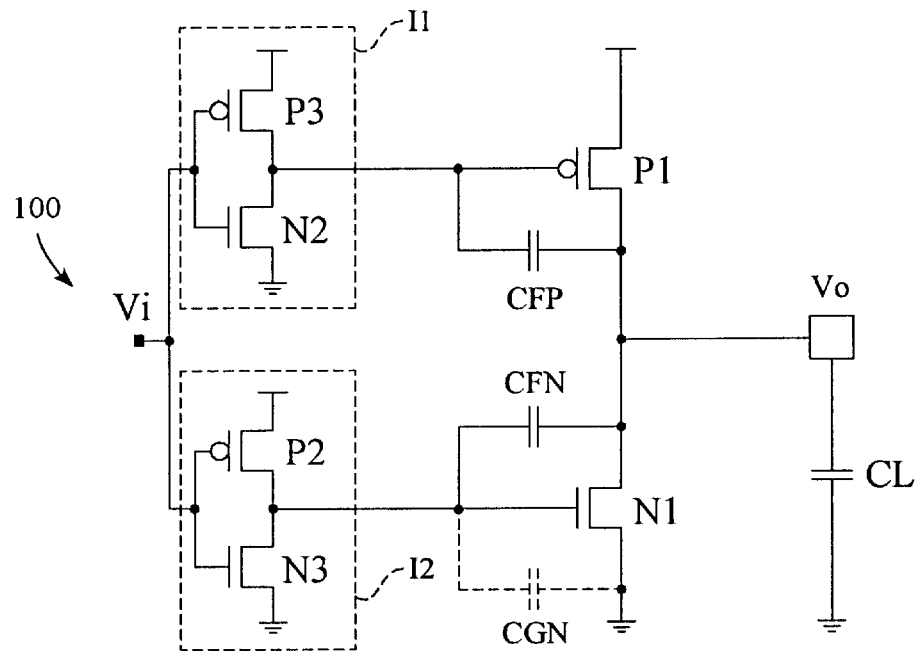
*Fig.* 1
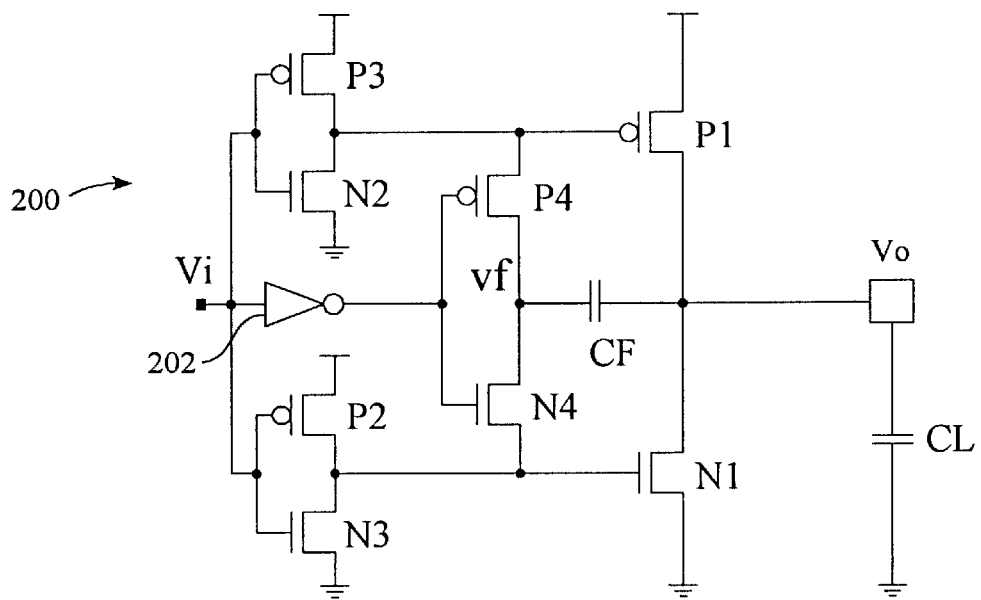
*Fig.* 6

ZERO-DELAY SLEW-RATE CONTROLLED OUTPUT BUFFER

TECHNICAL FIELD

The present invention generally relates to output buffer circuitry, and more specifically to a slew-rate controlled output buffer circuit.

BACKGROUND ART

Output buffers found in integrated circuits provide an interface for driving external loads, both capacitive and inductive. External capacitive loads typically consist of the bonding wire, the pin, conductors on the printed circuit board, and the input capacitances of the gates to which an output buffer is coupled. The inductive load usually comprises the series parasitic inductances of the power supply and ground lines supplying the output buffer which in turn are coupled to the external power and ground rails on the printed circuit board.

With traditional output buffers (i.e. an inverter chain), output transistor sizing is constrained by DC operating characteristics. This leads to several problems: unacceptably high current peaks which occur with the simultaneous switching of many output buffers; inductive power supply noise which results in large voltage drops, and electromagnetic interference due to high output edge switching rates.

Inductive switching noise appears as an undesired undershoot or overshoot in the internal power supply or ground voltage rails, as the buffer supplies current to or sinks current from an external load.

The resulting noise voltage is harmful in many ways. Firstly, non-switching circuits which share the same power and/or ground rails are subject to the switching noise of active circuits, potentially causing spurious transitions at the inputs of the non-switching circuits. Secondly, switching speed is degraded since the noise narrows the gap between the power supply and ground voltage levels. Inductive switching noise is exacerbated when there is simultaneous switching of two or more circuits.

Prior art solutions to these problems include reducing the signal swing, but at the cost of abandoning TTL compatibility, along with the added penalty of having to provide an extra power supply voltage. A simple approach is to slow down the turn-on time of the output switching transistor, but at the cost of having a transition time that is load-dependent and increasing the propagation delay.

A circuit is required which provides a load independent slew rate controlled output signal. The circuit should be simple in design so that a minimum amount of silicon is needed to implement the circuit.

SUMMARY OF THE INVENTION

A first embodiment of the output buffer of the present invention includes an input stage comprising first and second inverters, each having an input terminal coupled to the input node of the buffer. The output terminal of each inverter drives the control gate of an output transistor. The two output transistors are coupled in a common drain configuration to the output node of the buffer. A capacitive feedback path is provided between the buffer output node and the control gates of the output transistors. The feedback controls the gate voltage such that it is maintained at a constant voltage during most of the time that an external load capacitance is charging or discharging during a rising or falling transition. The result is a constant drain current through the active output transistor and thus a constant slew rate that is independent of the output load.

In a second embodiment of the present invention, the capacitive feedback path includes means for switching a capacitive element between each of the control gates of the output transistors. The capacitive element, already having a charge, serves to precharge the control gate of the active output transistor. This increases the response time of the output buffer and thus lowers the propagation delay.

BRIEF DESCRIPTION OF THE DRAWINGS

FIG. 1 shows a first embodiment of an output buffer in accordance with the present invention.

FIG. 6 is a second embodiment of the output buffer of the present invention.

BEST MODE FOR CARRYING OUT THE INVENTION

Figure 2A:
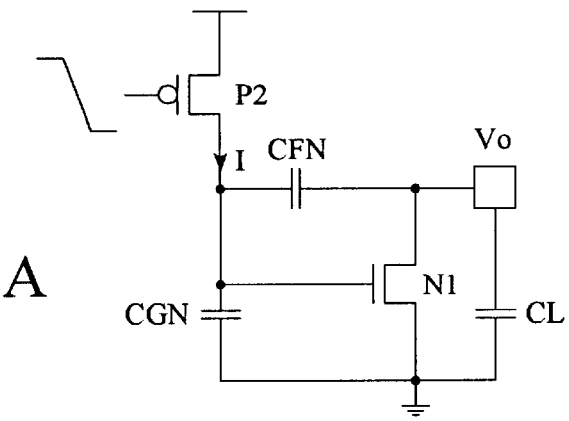
FIG. 2A is a portion of the buffer circuit of FIG. 1 which is involved in a falling edge transition.

Referring to FIG. 1, the output buffer circuit 100 in accordance with the present invention comprises an input node $v_i$ for receiving a digital signal. The input node is coupled to the control gates of four transistors: P-channel transistors P2 and P3 and N-channel transistors N2 and N3. Transistors P3 and N2 are coupled as an inverter I1, and transistors P2 and N3 are coupled as inverter I2.

The output of buffer 100 is driven by transistors P1 and N1, whose drains are coupled to output node $v_o$. The source of transistor P1 is coupled to $V_{DD}$ while the source of transistor N1 is coupled to ground potential. The control gate of transistor P1 is coupled to the drains of transistors P3 and N2 Similarly, the control gate of transistor N1 is coupled to the drains of transistors P2 and N3.

Further in accordance with the present invention, a feedback path from output node $v_o$ to the control gate of transistor P1 includes a capacitive element $C_{FP}$. Likewise, capacitive element $C_{FN}$ is provided between output node $v_o$ and the control gate of transistor N1. In the context of the present invention, a "capacitive element" is meant to refer to an actual capacitor device (e.g. devices $C_{FN}$ and $C_{FP}$) which is to be distinguished from the parasitic capacitances inherently present in transistor devices. For example, FIG. 1 shows in phantom the parasitic gate capacitance $C_{GN}$ for output transistor N1.

Still further in accordance with the present invention, for reasons which will become clear in the discussion below, transistor P3 is sized so that its W/L ratio is greater than that of transistor N2 In like manner, transistor N3 has a W/L ratio greater than that of transistor P2. The specific sizing of the devices depends upon the particular application. As an example, the transistor sizes used to generate the waveforms shown in the figures were: N1=120/0.8; P1=360/0.8; N2=2/24; P2=6/24; N3=10/0.8; and P3=30/0.8.

Turn now to a discussion of the operation of the circuit of FIG. 1. Consider the case of a falling transition of the input signal. At a time prior to such a transition, transistor P3 is OFF and transistor N2 is in saturation and thus fully ON. Thus, output transistor P1 is fully ON and so load capacitor $C_L$ is charged to $V_{DD}$ potential. Similarly, transistor P2 is OFF and transistor N3 is ON, thus keeping output transistor N1 in the non-conducting OFF state.

Consider next the transition of the input signal to the lower voltage level. In such a situation, transistor N2 begins to turn OFF and transistor P3 begins to turn ON. Likewise, transistor N3 begins to turn OFF while transistor P2 begins to conduct. Recall that transistors P3, N2, N3, and P2 are sized so that P3 is stronger than N2 and N3 is stronger than P2; i.e. the W/L ratios of P3 and N3 are greater than N2 and P2 respectively. The consequence of such sizing is that the "inactive" output transistor (transistor P1 in the case of a falling transition) will turn OFF faster than the "active" output transistor (namely transistor N1) is turned ON. Conversely, in the case of a rising transition, the "inactive" output transistor N1 will turn OFF faster than the "active" output transistor P1 turns ON by virtue of N3 being stronger than P2. This is an important aspect of the invention, because such transistor sizing serves to eliminate a short circuit current between output transistors P1 and N1 during logic level transitions, thus isolating the circuitry which controls falling edge transitions from the circuitry which controls rising edge transitions.

The falling edge circuitry of output buffer 100 comprises: output transistor N1, feedback capacitor $C_{FN}$, transistor P2, parasitic capacitance $C_{GN}$, and output load capacitor $C_L$. These elements are shown in FIG. 2A. The waveform shown in FIG. 3 schematically illustrates three periods of time during the operation of the buffer for a falling edge transition.

Figure 2B:
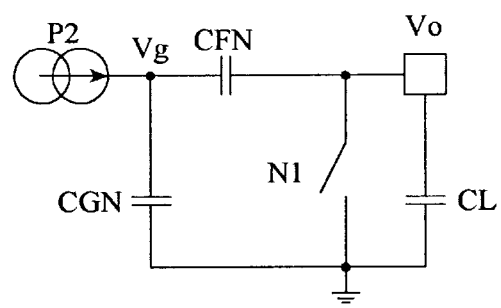
FIGS. 2B and 2C are equivalent circuits of FIG. 2A during different stages of circuit operation.
Figure 3:
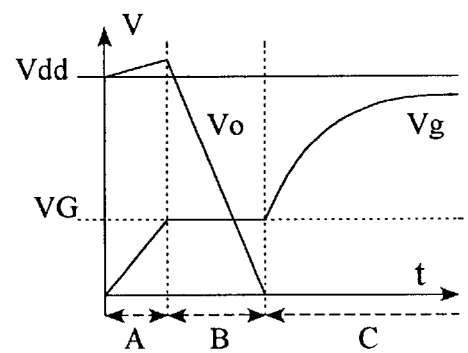
FIG. 3 illustrates a schematic representation of the three regions of operation of the present invention for a falling edge transition.

Referring to FIGS. 2B and 3, transistor N1 is OFF at the beginning of region A, and is shown in the equivalent circuit of FIG. 2B as a switch in the open position. Transistor P2 is in saturation and thus behaves like a constant current source, charging the parasitic gate capacitance $C_{GN}$ of transistor N1 until node $v_g$ reaches the threshold voltage of N1. In the meantime, since N1 is OFF, the increasing voltage at node $v_g$ causes a corresponding increase in $v_o$ through feedback capacitor $C_{FN}$. The time equations of the variation at node $v_g$ and at the output node vo can be determined.

The time function $v_g(t)$ for node $v_g$ is:

$$v_g(t) = \frac{I}{C_1} \cdot t \qquad \text{Eqn. 1}$$

where $C_1$ is the total capacitance node $v_g$ and I is the current provided by transistor P2

$$C_1 = C_{GN} + \frac{C_{FN} C_L}{C_{FN} + C_L}$$

The time function $v_o(t)$ for the output node is:

$$v_o(t) = V_{DD} + \frac{C_{FN}}{C_{FN} + C_L} \cdot v_g(t) \qquad \text{Eqn. 2}$$

Figure 2C:
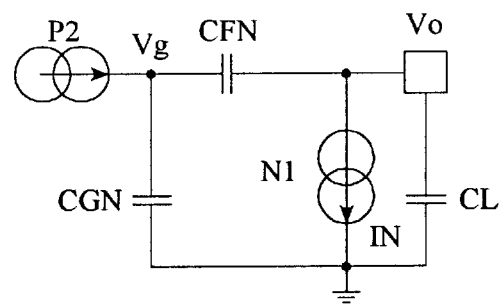

Referring to FIGS. 2C and 3, operation of the output buffer in region B and the corresponding equivalent circuit are shown. As P2 continues to charge capacitor $C_{FN}$, the gate voltage at node $v_g$ continues to rise until output transistor N1 begins to turn ON. Consequently, the output load $C_L$ begins to discharge through N1. At the same time, capacitor $C_{FN}$ also begins to discharge through N1. This tends to slow the rising voltage at node $v_g$, which in turn reduces the current in N1. The rate at which $C_{FN}$ discharges through N1 depends on the size of the load capacitance $C_L$.

$C_{FN}$, however, continues to be charged by transistor P2. This tends to raise the potential at node $v_g$, and consequently the current in N1. This feedback effect will result in an equilibrium state where the discharge rate of capacitor $C_{FN}$ through output transistor N1 is balanced by the charge rate of transistor P2. Thus at equilibrium, the voltage at node $v_g$ (i.e. the gate voltage of transistor N1) remains constant during operation of the output buffer 100 in region B.

Since the gate voltage remains constant, output transistor N1 behaves like a constant current source, generating a constant output slope. The fall time for a falling edge transition therefore is perfectly controlled in this fashion.

As in the case of operation in region A, the equations for the voltage a node $v_g$ and the time function $v_o(t)$ for output node $v_o$ can be determined. The standard quadratic equation for modeling transistor activity in saturation is used for transistor N1, namely:

$$I_{N1} = \frac{K_{N1}}{2} \cdot (V_g - V_{TN1})^2 \qquad \text{Eqn. 3}$$

where:
 $K_{N1}$ is the transistor gain of N1
 $V_{TN1}$ is the threshold voltage of N1
 $I_{N1}$ is the current in N1
From which the constant gate voltage at node $v_g$ is:

$$V_g = V_G = V_{TN1} + \sqrt{I_{N1} \frac{2}{K_{N1}}} \qquad \text{Eqn. 4}$$

At equilibrium, $v_g$ is constant because N1 gate charging (by current I) is fully compensated by the discharge of the output load, leading to:

$$I = -C_{FN} \frac{dv_o}{d_t} \qquad \text{Eqn. 5}$$

$$\frac{dv_o}{d_t} = -\frac{I}{C_{FN}}$$

and the current in transistor N1 is:

$$I_{N1} = -(C_L + C_{FN}) \frac{dv_o}{d_t}, \qquad \text{Eqn. 6}$$

Eqns. 5 and 6 can be used together to recast Eqn. 4 as:

$$I_{N1} = IC_L + \frac{C_{FN}}{C_{FN}} \qquad \text{Eqn. 7}$$

$$V_G = V_{TN1} + \sqrt{\frac{2I}{K_{N1}} \cdot \frac{(C_L + C_{FN})}{C_{FN}}}$$

The time varying function $v_o(t)$ for the output voltage is determined as follows:

$$I = -C_{FN} \frac{dv_o}{dt} \qquad \text{Eqn. 8}$$

$$V_o(t) = V_{DD} + \frac{C_{FN}}{C_{FN} + C_L} \cdot V_G - \frac{I}{C_{FN}}(t - t_A)$$

where:
$t_A$ is the duration of region A and is equal to $$\frac{C1 \cdot V_G}{I},$$

$C_1$ being taken from Eqn. 1;
$V_G$ is the constant gate voltage expressed in Eqn. 7; and the integration constant is $$V_{DD} + \frac{C_{FN}}{C_{FN} + C_L} \cdot V_G,$$

which takes into account the overshoot induced by the feedback capacitor during operation in region A.

The voltage $V_G$ represents the control voltage to be applied to the output transistor N1 in order to discharge the output load $C_L$ with a constant slope in a given time. It can be seen that the output slope is constant and depends only on internal elements, namely the charging current I provided by transistor P2 and the capacitance of feedback capacitor $C_{FN}$. The current $I_{N1}$ through output transistor N1 during the discharge is adjusted to the load $C_L$, so that the slope of the output $v_o$ is independent of the load.

Referring once again to FIG. 3, operation of the buffer in region C continues with the gate voltage at node vg continuing to rise after the load capacitor is fully discharged. The gate of output transistor N1, therefore, will continue to rise until it reaches $V_{DD}$ providing at that time full DC characteristics.

From the above equations, the propagation delay $t_{PHL}$ and the fall time $t_{SHL}$ can be deduced. The propagation delay is the sum of the delay in region A $t_A$ and the delay necessary for the output to reach one-half of the supply voltage $V_{DD}$, thus:

$$t_{PHL} = \frac{C_{FN} + C_{GN}}{I} V_G + \frac{C_{FN}}{I} \cdot \frac{V_{DD}}{2} \qquad \text{Eqn. 9}$$

The fall time is measured between 90% and 10% of the output variation, thus:

$$t_{SHL} = \frac{C_{FN}}{I} \cdot 0.8 V_{DD} \qquad \text{Eqn. 10}$$

Notice that in Eqn. 10, the fall time is independent of the output load $C_L$.

Figure 4B:
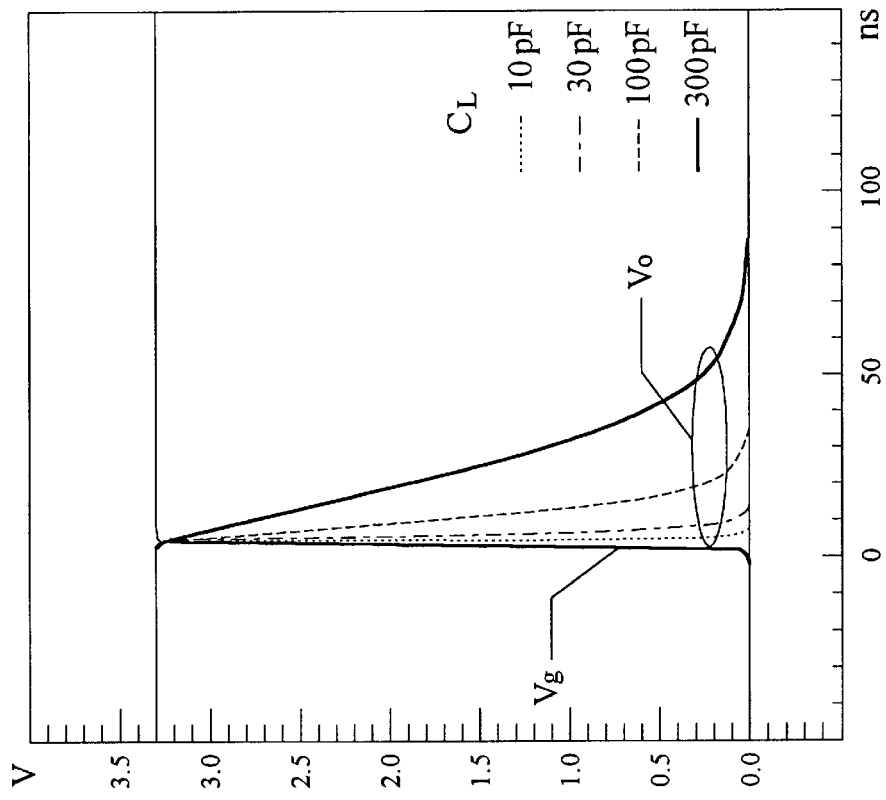
FIGS. 4A and 4B are simulated gate and output waveforms respectively for the output buffer of the present invention and for a classic output buffer, during a falling edge transition.
Figure 4A:
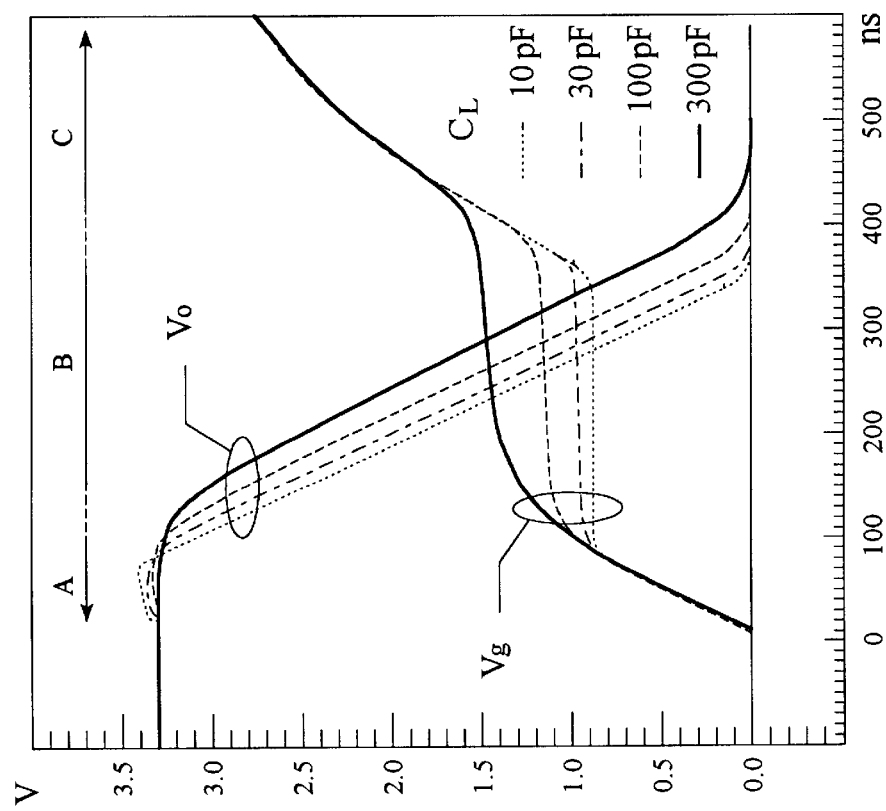

Turn now to the waveforms shown in FIGS. 4A and 4B. These waveforms show the gate voltage measured at node $v_g$ and the output voltage measured at output node $v_o$. Waveforms are generated for varying output loads: 10 pF, 30 pF, 100 pF, and 300 pF; for an output buffer in accordance with the present invention shown in FIG. 4A and for a classic output buffer shown in FIG. 4B. FIG. 4A also identifies the three regions A–C of operation initially shown in FIG. 3.

Consider first FIG. 4A. The effect of the feedback capacitor is shown in region B where the gate voltage is flat. As a result of the constant gate voltage, the slew rate of the signal at the output node $v_o$ is constant for all capacitive loads. The effects of the load capacitance do not come into play until the device is operating in region B. As shown in FIG. 4A, the load capacitance $C_L$ determines the time it takes for the charging and discharging of feedback capacitor $C_{FN}$ to reach equilibrium, as evidenced by the onset of the flat portion of the $V_g$ waveforms.

By comparison, the waveform shown in FIG. 4B of a classic buffer without the feedback capacitor shows that the gate voltage reaches $V_{DD}$ almost instantaneously, thus putting output transistor N1 immediately into saturation. Consequently, with transistor N1 at maximum conductivity, the discharge rate at the output node $v_o$ is a function of the time constant defined by the load capacitance $C_L$ and the channel resistance of N1. The slew rate therefore will vary with the capacitive load, since the channel resistance remains constant.

Figure 5B:
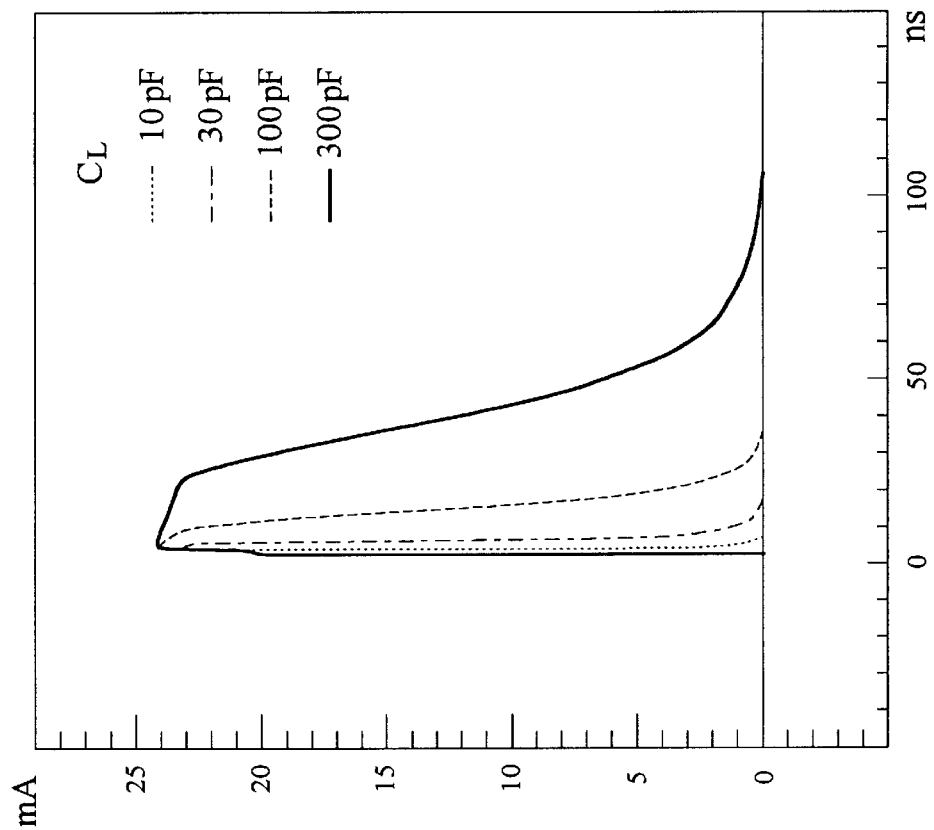
FIGS. 5A and 5B are simulated current waveforms respectively for the output buffer of the present invention and for a classic output buffer, during a falling edge transition.
Figure 5A:
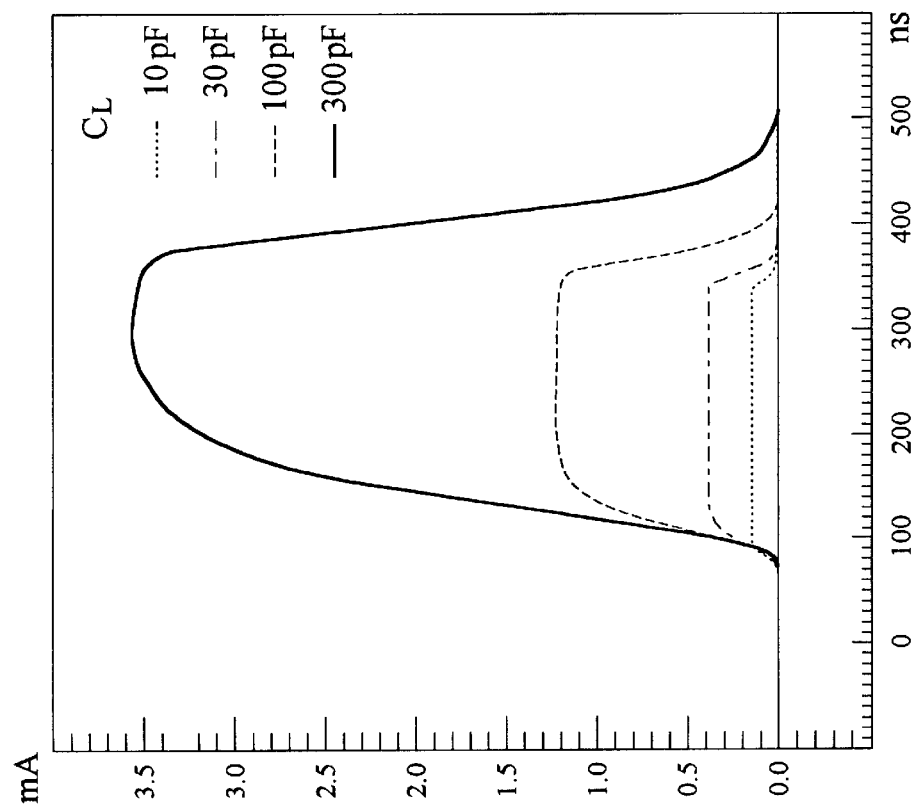

FIG. 5A shows that output buffer 100 produces a constant drain current in transistor N1 during operation in region B, the current self-adjusts to different levels depending on the load $C_L$. Because of this self-adjusting behavior, the discharge time is the same regardless of the size of the load. A larger load having a greater charge stored, will discharge more current in a given amount of time, while a smaller load having a smaller charge stored will discharge less current in that same amount of time. The result is a constant slew rate regardless of load capacitance. In contrast, the drain current profile of a classic output buffer shown in FIG. 5B indicates that the load discharges at the maximum rate, the time for discharge simply being a function of the amount of charge stored in the load. The result is a slew rate that varies depending on the load capacitance.

As a final observation, the propagation delay of the present invention is increased by a factor of about eight, as can be seen by comparing the output waveforms in FIGS. 4A and 4B. Referring to FIGS. 5A and 5B, the circuit of the present invention shows a reduced current peak by the same factor. The reduced current peak helps to minimize noise. As can be seen in FIG. 5A, the current reducing capability is even better for smaller loads.

The foregoing discussion addresses the operation of the output buffer during a falling transition, and so focuses on the bottom half of the buffer circuitry 100 depicted in FIG. 1. A similar analytical treatment is possible with respect to a rising transition which involves the upper half of the buffer circuitry. It can be shown that for a rising transition, the slope of the changing voltage at output node $v_o$ is the same regardless of the capacitive load $C_L$.

Turn now to FIG. 6 for a discussion of a second embodiment of the invention. Transistors P1–P3 and N1–N3 are the same as those comprising output buffer 100 in FIG. 1. The embodiment shown in FIG. 6 includes an inverter 202 whose input is coupled to input node $v_i$. Transistor P4 has a first terminal coupled to the control gate of output transistor P1 and a second terminal coupled to node $v_f$. Transistor N4 has a first terminal coupled to the control gate of output transistor N1 and a second terminal coupled to node $v_f$. The gates of transistors P4 and N4 are tied together and coupled to the output of inverter 202. A feedback capacitor $C_F$ is coupled between output node $v_o$ and node $v_f$. As will be discussed below, transistors P4 and N4 serve as a switching element to selectively couple one end of feedback capacitor $C_F$ either to the control gate of output transistor P1 or the control gate of output transistor N1.

Operation of the circuit 200 shown in FIG. 6 is similar to the circuit of FIG. 1 in all respects, except for the following aspect. Consider a falling transition. The conditions just prior to the transition are: the potential at input node $v_i$ is $V_{DD}$. Thus, transistors N2, N3, and P4 are turned ON, while transistors P3, P2, and N4 are OFF. Consequently, the gate voltage of output transistor P1 is held at zero by transistor N2, and the gate voltage of output transistor N1 is held at zero by transistor N3. P1 is therefore ON and output node $v_o$ is held at $V_{DD}$.

The output of inverter 202 is zero, thus turning ON transistor P4 and turning OFF transistor N4. Observe that although P4 is ON, the potential at node $v_f$ cannot rise above $-V_{tP4}$, the threshold voltage of P4. The reason is that, under these conditions, node $v_f$ is the source node for P4. Recall that conduction occurs when $V_{gs} >= V_t$. In this case, $V_{gs} = 0 - V_f$, where $V_f$ is the potential at node $v_f$. When $V_f$ reaches $-V_{tPb4}$, any tendency for node $v_f$ to rise above $-V_{tP4}$ will turn OFF P4. $V_f$, therefore, stabilizes at $-V_{tP4}$. Similarly, it can be shown that in a rising transition scenario $V_f$ will not rise above $(V_{DD} - V_{tN4})$.

When the transition occurs, transistor N4 turns ON, thus transferring the charge at feedback capacitor $C_F$ to the gate of output transistor N1 through a process known as charge sharing. Thus, the gate of N1 can be precharged to a level close to its threshold voltage by appropriately sizing the feedback capacitor $C_F$.

In accordance with the invention, N4 is fully turned ON prior to transistor P2 turning ON. This is accomplished by sizing the P-channel and N-channel transistors of inverter 202 so that they are faster than P3/N2 and P2/N3. Thus, during a falling transition, inverter 202 will go high before transistor P2 turns ON, and during a rising transition, the inverter will go low before transistor N2 turns ON. This provides a quick precharge of the gate of N1 (or P1 in the case of a rising transition) before the transistor P2 (N2) turns ON and begins charging the gate. By precharging the gate, the output load $C_L$ can begin to discharge at an earlier time during the transition as compared to the buffer circuit of FIG. 1. Consequently, the propagation delay is reduced. The gain on the propagation delay due to the precharging is equal to the delay necessary, with the circuit of FIG. 1, for the gate voltage to reach the precharge voltage. Considering that the value of the feedback capacitor $C_F$ is negligible against the value of the output load $C_L$, the following expression for the propagation delay is obtained:

$$t_{PHL} = \frac{C_F + C_L}{I} V_G + \frac{C_F}{I} \cdot \left( \frac{V_{DD}}{2} - |V_t| \right) \qquad \text{Eqn. 11}$$

where:
Vt is the theshold voltage of transistor P4 in the case of falling transitions, and N4 in the case of rising transitions.

In addition, overshoots are also reduced because of the precharging by feedback capacitor $C_F$. The precharging eliminates the charge build-up at the output that occurs with the circuit of FIG. 1 as the gate capacitance is being charged during operation in region A (FIG. 3). With precharging, there is effectively no region A.

Figures 7A, 7B:
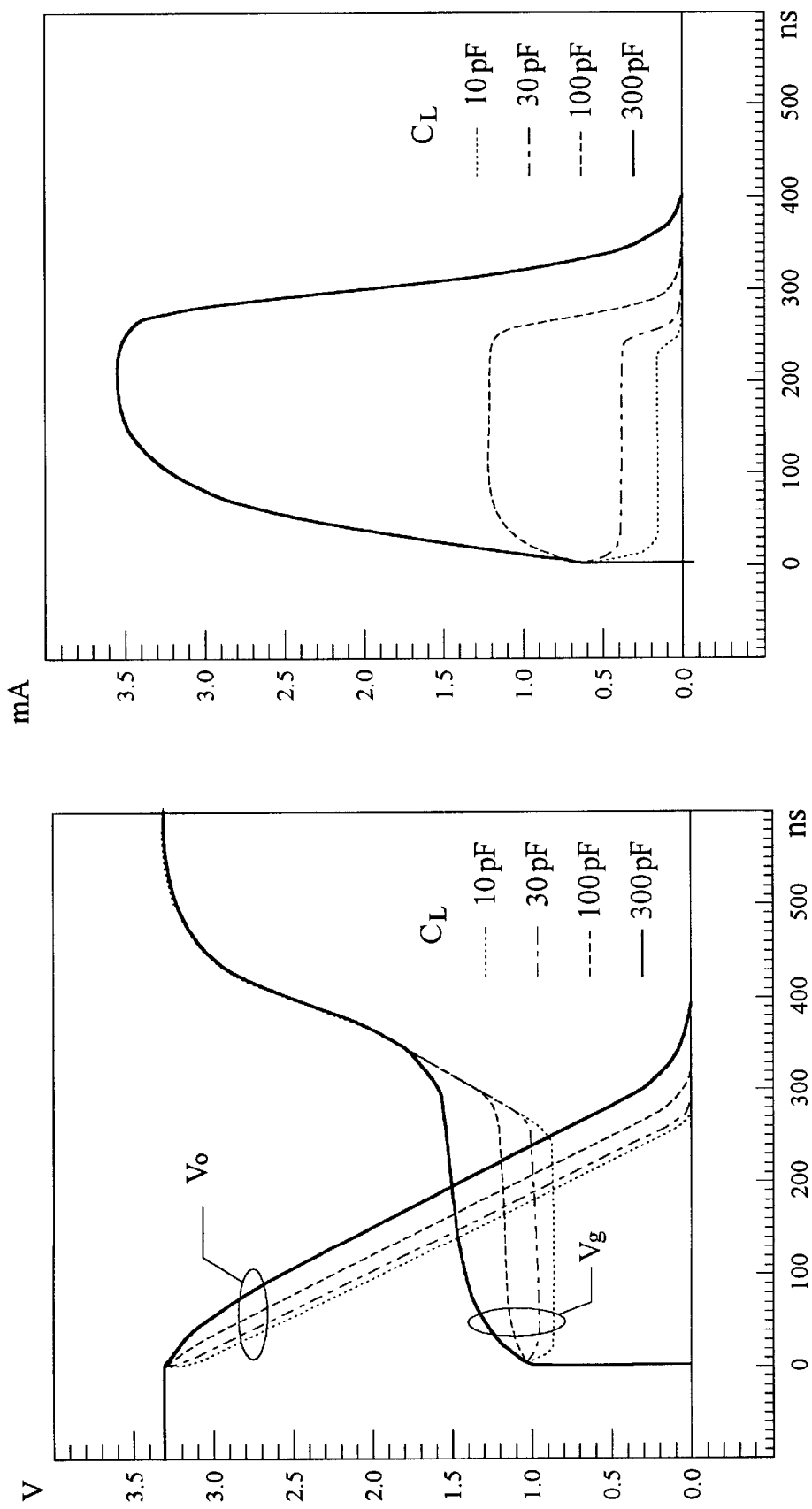
FIGS. 7A and 7B are simulated waveforms illustrating the operation of the circuit of FIG. 6, for a falling edge transition.

The is shown in FIG. 7A where it can be seen that the gate voltage instantly reaches the threshold voltage of the output transistor (P1, N1) due to precharging by the feedback capacitor. Thus, the onset of the falling edge occurs at a time earlier than in the circuit of FIG. 1, and so propagation delay is reduced. Note that precharging also has eliminated the overshoot that exists at the onset of the falling transition in the circuit of FIG. 1. The drain current profiles of FIG. 7B also show the increased responsiveness of output buffer 200 as compared to the profile of FIG. 5A for output buffer 100.

Another aspect of the embodiment of FIG. 6 is the reduced area of the circuitry on silicon. Note that the circuit of FIG. 6 uses one feedback capacitor $C_F$ as compared to the circuit of FIG. 1 which uses two feedback capacitors $C_{FN}$, $C_{FP}$. Capacitors consume a large area as compared to transistors. For example, a 1 pF capacitor is roughly 25×55 $\mu$M in area. Thus, while the circuit of FIG. 6 uses more transistors than does the circuit of FIG. 1, the total area required of the former circuit is still smaller than that of the latter circuit because of the use of only one capacitor. Typical W/L ratios for transistors N4, P4 are 8/0.8 $\mu$M and 24/0.8 $\mu$M respectively. Similarly, the transistors comprising inverter 202, are also small; e.g. 4/0.8 $\mu$M for the N-channel device and 12/0.8 $\mu$M for the P-channel device are deemed sufficient for driving the small gate capacitances of transistors N4 and P4.

I claim:

1. An output buffer circuit comprising:

a signal-receiving node;

a first inverter having input and output terminals, the input terminal coupled to the signal-receiving node;

a second inverter having input and output terminals, the input terminal coupled to the signal-receiving node;

a first output transistor having first and second terminals and having a gate terminal coupled to the output terminal of the first inverter;

a second output transistor having first and second terminals and having a gate terminal coupled to the output terminal of the second inverter;

a signal output node to which the second terminal of the first output transistor and the first terminal of the second output transistor are coupled; and a capacitive feedback means for coupling the signal output node back to the gate terminals of the first and second output transistors, including third and fourth transistors coupled in series and connected between the gates of the first and second output transistor, and a third inverter coupled between the signal-receiving node and gates of the third and fourth transistors.

2. The output buffer circuit of claim 1 wherein the first output transistor is a P-channel device and the second output transistor is an N-channel device.

3. The output buffer circuit of claim 2 wherein the third transistor is a P-channel device and the fourth transistor is an N-channel device.

4. The output buffer circuit of claim 1 wherein the first inverter includes a P-channel device and an N-channel device, the P-channel device having a greater W/L ratio than the N-channel device.

5. The output buffer circuit of claim 4 wherein the second inverter includes a P-channel device and an N-channel device, the N-channel device having a greater W/L ratio than the P-channel device.

* * * * *